United States Patent
Maloberti et al.

(10) Patent No.: US 7,525,464 B2
(45) Date of Patent: *Apr. 28, 2009

(54) SIGMA-DELTA MODULATOR WITH DAC RESOLUTION LESS THAN ADC RESOLUTION

(75) Inventors: Franco Maloberti, Torre D'Isola (IT); Masood Yousefi, Sunnyvale, CA (US); Ahmad Bahai, Lafayette, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/754,442

(22) Filed: May 29, 2007

(65) Prior Publication Data

US 2008/0297386 A1    Dec. 4, 2008

(51) Int. Cl.
*H03M 3/00* (2006.01)
(52) U.S. Cl. ..................... 341/143; 341/155
(58) Field of Classification Search .......... 341/143–160
See application file for complete search history.

(56) References Cited

U.S. PATENT DOCUMENTS

| | | | |
|---|---|---|---|
| 6,696,998 B2 | 2/2004 | Ying et al. | |
| 6,967,608 B1 | 11/2005 | Maloberti et al. | |
| 6,980,144 B1 | 12/2005 | Maloberti et al. | |
| 7,006,028 B2* | 2/2006 | Galton | 341/144 |
| 7,183,954 B1* | 2/2007 | Melanson et al. | 341/143 |
| 7,190,294 B2* | 3/2007 | Melanson | 341/143 |
| 7,196,647 B2* | 3/2007 | Melanson | 341/143 |

OTHER PUBLICATIONS

Leslie, T.C. and Singh, B., "Sigma-Delta Modulators with Multibit Quantising Elements and Single-Bit Feedback", IEE Proceedings-G, vol. 139 No. 3, Jun. 1992, pp. 356-362.
U.S. Appl. No. 11/850,960, "Sigma-Delta Modulator with DAC Resolution Less Than ADC Resolution and Increased Tolerance of Non-Ideal Integrators", filed Sep. 6, 2007.
U.S. Appl. No. 11/850,979, entitled "Sigma-Delta Modulator with DAC Resolution Less than ADC Resolution and Increased Dynamic Range", filed Sep. 6, 2007.
U.S. Appl. No. 11/839,018, "Phase-Frequency Detector with High Jitter Tolerance", filed Aug. 15, 2007, 16 pages.

* cited by examiner

*Primary Examiner*—Lam T Mai
(74) *Attorney, Agent, or Firm*—Vedder Price P.C.

(57) ABSTRACT

A sigma-delta modulator is provided with a feedback digital-to-analog converter having less resolution than the quantizer, while providing a reduced length output word, requiring minimal additional internal processing, and shaping of the truncation error by an effective noise transfer function greater than the order of the host sigma-delta modulator.

7 Claims, 2 Drawing Sheets

SIGMA-DELTA MODULATOR WITH DAC RESOLUTION LESS THAN ADC RESOLUTION

BACKGROUND OF THE INVENTION

1. Field of the Invention

The present invention relates to sigma-delta modulators, and in particular, to sigma-delta modulators in which the resolution of the feedback digital-to-analog converter (DAC) is less than the resolution of the analog-to-digital converter (ADC) used in the modulator loop.

2. Related Art

Sigma-delta analog-to-digital modulators are often used in a sigma-delta ADC or sigma-delta DAC for providing shaping (filtering) of quantization noise. As the order of the sigma-delta modulator increases, the quantization noise is pushed further away in the frequency band from the signal being converted. Accordingly, sigma-delta ADCs and DACs, as well as their associated modulators, have become widely used in high precision applications.

A key design issue is the choice between a single-bit or a multi-bit quantizer, and in the case of a multi-bit quantizer, the number of bits to be used. With a single bit, the quantizer is binary and interpolation between its two output levels provides a linear response. Accordingly, single-bit architectures are often used since they provide high resolution without requiring accurate analog circuit elements.

However, since the resolution of the sigma-delta modulator relies on the oversampling ratio and the order of the modulator, obtaining a high signal-to-noise ratio (SNR) with relatively large signal bandwidths is problematic since the stability of higher order modulators costs a gain factor in the noise transfer function (NTF) and matching is critical in designing basic circuit blocks for cascaded architectures at high SNRs, e.g., above 90 dB.

A single-bit modulator also has a number of design requirements. Since both signal and quantization noise contribute to the output swing of the integrators, a large quantization step causes a large swing in the output voltage of the operational amplifiers. This requires using a small reference voltage relative to the power supply voltage.

A multi-bit quantizer increases the SNR (i.e., an improvement of SNR of approximately 6 dB for each additional bit). Also, using a multi-bit modulator reduces limits of a single-bit implementation, such as constraints on the reference voltage or demanding slew rate specifications, but does not provide the important characteristic of intrinsic linearity. Since the linearity of the noise-shaping elements depend upon the linearity of the DAC, it is necessary to use well-matched components to provide a DAC with the required linearity. Normally, such matching of integrated components is not adequate for high resolutions (e.g., more than 10-12 bits). Further, with a multi-bit architecture, the input of the downstream digital filter is a high-speed, multi-bit signal that requires complex processing prior to the first decimation. Further still, a multi-bit DAC is more difficult to fabricate in a very large scale integration (VLSI) environment with sufficient linearity needed for the high resolution quantized signal $y_1$ and low resolution (truncated) signal $y_2$.

Referring to FIG. 1, reducing the number of levels, or bits, in the internal DAC of a sigma-delta modulator has been implemented in the form of post-processing of the quantized $y_1$ and truncated $y_2$ signals. In this implementation, represented by its linear model, a classic second order sigma-delta modulator 10 includes adder circuits 12a, 12b, integrators 14a, 14b, a high resolution (i.e., multi-bit) quantizer 16 (with quantization error $\epsilon_Q$), a truncation circuit 18 (with truncation error $\epsilon_T$), and a feedback DAC 20. A post-processor 22 processes the quantized $y_1$ and truncated $y_2$ signals.

The truncation of the quantized signal $y_1$ adds truncation error $\epsilon_T$ and provides a lower resolution output signal $y_2$. These signals $y_1$, $y_2$ can be expressed as follows:

$$y_1 = p + \epsilon_Q \qquad (1)$$

$$y_2 = p + \epsilon_Q + \epsilon_T = p + \epsilon_{QT} \qquad (2)$$

The truncated signal $y_2$ is fed back to the adders 12a, 12b. Accordingly, this signal can be expressed as follows (where STF is the signal transfer function and NTF is the noise transfer function):

$$y_2 = x \cdot STF + \epsilon_{QT} \cdot NTF \qquad (3)$$

The analog input signal p to the quantizer 16 can be expressed as follows:

$$p = y_1 - \epsilon_Q = y_2 - \epsilon_{QT} \qquad (4)$$

Substituting Equation (4) into Equation (3), the truncated signal $y_2$ can be expressed as follows:

$$y_2 = x \cdot STF + (y_2 - y_1 + \epsilon_Q) \cdot NTF \qquad (5)$$

Rearranging this produces the following expression:

$$y_2 \cdot (1 - NTF) + y_1 \cdot NTF = x \cdot STF + \epsilon_Q \cdot NTF \qquad (6)$$

Accordingly, it can be seen that signal processing is required to obtain shaping of the quantization error $\epsilon_Q$ instead of the larger truncation error $\epsilon_T$. However, a problem associated with this technique is the post-processing 22 required must be done using a significantly larger number of bits due to the need to process both the quantized $y_1$ and truncated $y_2$ signals.

Other implementations have been proposed in which the digital feedback signal is truncated through a digital sigma-delta modulator that shapes the truncation error. However, since the resulting error is injected at the input of the modulator, its shaping must be of a higher order than the order of the analog modulator. Moreover, the number of bits at the output of the modulator (see, e.g., U.S. Pat. No. 6,980,144, the disclosure of which is incorporated herein by reference) correspond to the resolution of the quantizer, and the first stage of the digital filter used in the decimation is complex as it operates with a long input word. The order of sigma delta modulator used for the truncation must be higher than the order of the modulator as the corresponding error is injected at the input of the quantizer. Therefore, for a second order modulator the truncation must be done by at least a third order scheme with the additional request to have zero delay. This problem is limited by a cancellation of the effect of the truncation error in the analog domain (see, e.g., U.S. Pat. No. 6,967,608, the disclosure of which is incorporated herein by reference). Combining these techniques (e.g., as disclosed in U.S. Pat. Nos. 6,980,144 and 6,967,608) enables the use of a lower order in the truncation generator, although it must still be at least an order of two to ensure suitable shaping and accounting for mismatch between the analog and digital transfer functions used in the cancellation mechanism.

SUMMARY OF THE INVENTION

In accordance with the presently claimed invention, a sigma-delta modulator is provided with a feedback digital-to-analog converter having less resolution than the quantizer, while providing a reduced length output word, requiring minimal additional internal processing, and shaping of the truncation error by an effective noise transfer function greater than the order of the host sigma-delta modulator.

In accordance with one embodiment of the presently claimed invention, a sigma-delta modulator includes:
an input electrode to convey an analog input signal;
one or more output electrode to convey one or more digital output signals;
one or more adder circuits, wherein a first adder circuit is coupled to the input electrode to receive the analog input signal and one or more analog feedback signals and provide a first one of one or more summation signals, and each remaining one of the one or more adder circuits is to receive a respective upstream one of one or more integration signals and a respective additional one of the one or more analog feedback signals and provide a respective additional one of the one or more summation signals;
one or more integrator circuits, wherein a first integrator circuit is coupled to the first adder circuit to receive the first one of the one or more summation signals and provide a first one of the one or more integration signals, and a last integrator circuit is coupled to a last one of the one or more adder circuits to receive a last one of the one or more summation signals and provide a last one of the one or more integration signals;
analog-to-digital converter (ADC) circuitry coupled to the last integrator circuit and responsive to the last one of the one or more integration signals by providing an N-bit digital signal;
truncation circuitry coupled between the ADC circuitry and the one or more output electrodes and responsive to the N-bit digital signal by providing the one or more digital output signals including an M-bit digital signal, wherein N>M; and
digital-to-analog converter (DAC) circuitry coupled between the one or more output electrodes and each of the one or more adder circuits to receive at least one of the one or more digital output signals and provide the one or more analog feedback signals.

In accordance with another embodiment of the presently claimed invention, a sigma-delta modulator includes:
one or more adder, wherein a first adder means is for adding the analog input signal and one of one or more analog feedback signals to provide a first one of one or more summation signals, a last adder means is for providing a last one of the one or more summation signals, and each remaining one of the one or more adder means is for adding a respective upstream one of one or more integration signals and another of the one or more analog feedback signals to provide a respective additional one of the one or more summation signals;
one or more integrator means, wherein a first integrator means is for integrating the first one of the one or more summation signals to provide a first one of the one or more integration signals, and a last integrator means is for integrating a last one of the one or more summation signals to provide a last one of the one or more integration signals;
analog-to-digital converter (ADC) means for converting the last one of the one or more integration signals to an N-bit digital signal;
truncation means for truncating the N-bit digital signal to provide one or more digital output signals including an M-bit digital signal, wherein N>M; and
digital-to-analog converter (DAC) means for converting at least one of the one or more digital output signals to the one or more analog feedback signals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
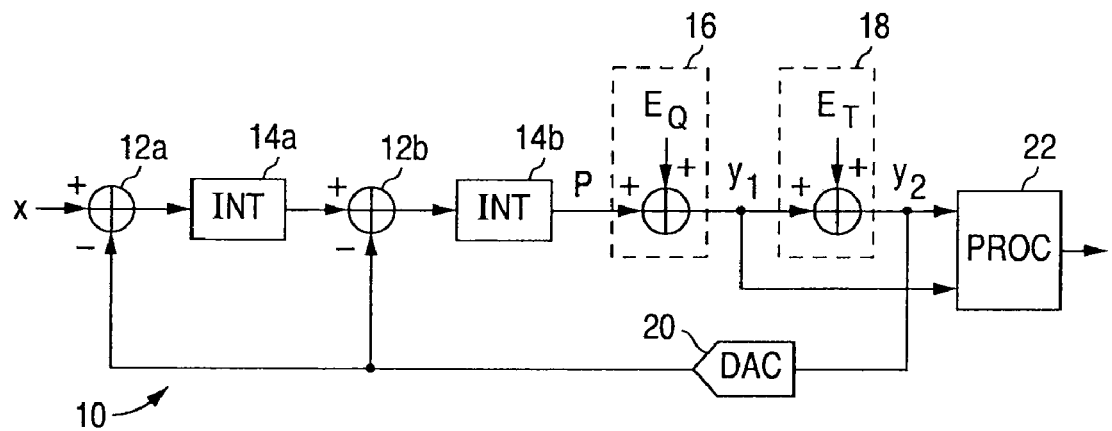
FIG. 1 is a functional block diagram of a second order sigma-delta modulator using a conventional DAC resolution reduction technique.
Figure 2:
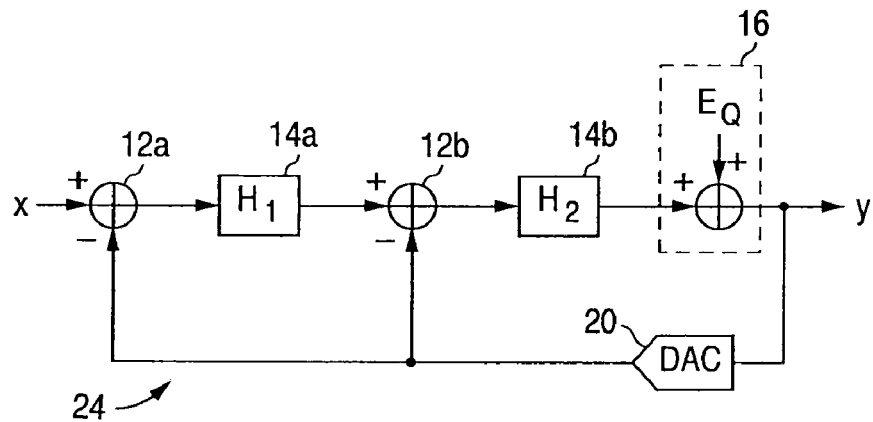
FIG. 2 is a functional block diagram of a conventional second order sigma-delta modulator.

Referring to FIG. 2, in a conventional second order sigma-delta modulator 20, the usual equations describing its operation are as follows:

$$\{(x-y)H_1-y\}H_2+\epsilon_Q=y \tag{7}$$

$$y=x*z^{-1}+\epsilon_Q(1-z^{-1})^2 \tag{8}$$

For an N-bit quantizer 16, the word length of its output signal y is N-bits and it adds a quantization error $\epsilon_Q$ caused by the N-bit quantization. When the output y is reduced from N-bits to M-bits, this corresponds to the injection of an additional noise in the form of truncation noise $\epsilon_T$ due to the truncation operation that reduces the resolution from N-bits to M-bits as if the modulator 20 used an M-bit quantizer.

Figure 3A:
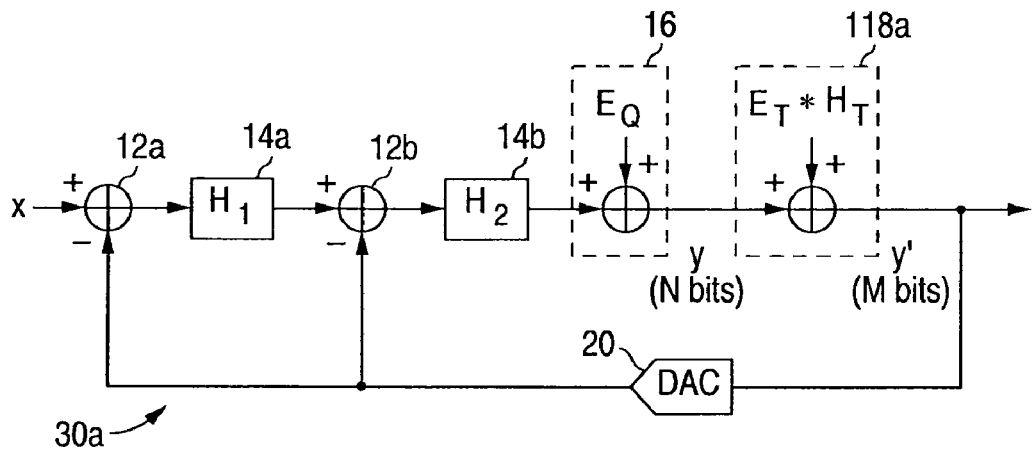
FIG. 3A is a functional block diagram using a DAC resolution reduction technique in accordance with one embodiment of the presently claimed invention.

Referring to FIG. 3A, in accordance with the presently claimed invention, it is intended to retain the benefit of the higher N-bit quantization by processing the truncation error $\epsilon_T$ in accordance with a filtering function $H_T$, thereby introducing a processed truncation error $\epsilon_T*H_T$ rather than the conventional truncation error $\epsilon_T$. The truncated output signal y' has a shorter word length of M-bits, and the operation of this modulator 30a can be expressed as follows:

$$\{(x-y')H_1-y'\}H_2+\epsilon_Q+\epsilon_T H_T=y' \quad (9)$$

$$y'=x*z^{-1}+(\epsilon_Q+\epsilon_T H_T)(1-z^{-1})^2 \quad (10)$$

The filter transfer functions H1, H2 as respective functions of z are not specified here with particularity since a number of types of integrators (e.g., with and without delays as desired) can be used in accordance with the presently claimed invention. Nonetheless, it will be readily appreciated by one of ordinary skill in the art that Equation (10) is derived from Equation (9).

From these equations, it can be seen that the truncation error $\epsilon_T$ is shaped by the same transfer function as the quantization error $\epsilon_Q$ but is also filtered by the filtering function $H_1$. Filtering the truncation error $\epsilon_T$ with a moderate high pass component is enough because, as shown by equation (10), the modulator already provides a shaping equal to the order of the modulator. The order of the extra shaping depends on the specific truncation level used.

While the modulator 30a of FIG. 3A is depicted as being of second order with first 12a and last 12b adders and first 14a and last 14b integrators, it will be readily appreciated by one of ordinary skill in the art that a first order modulator can also be implemented in accordance with the presently claimed invention. Such a sigma-delta modulator would include one adder (therefore both the first and last adder) and one integrator (therefore both the first and last integrator).

Figure 3B:
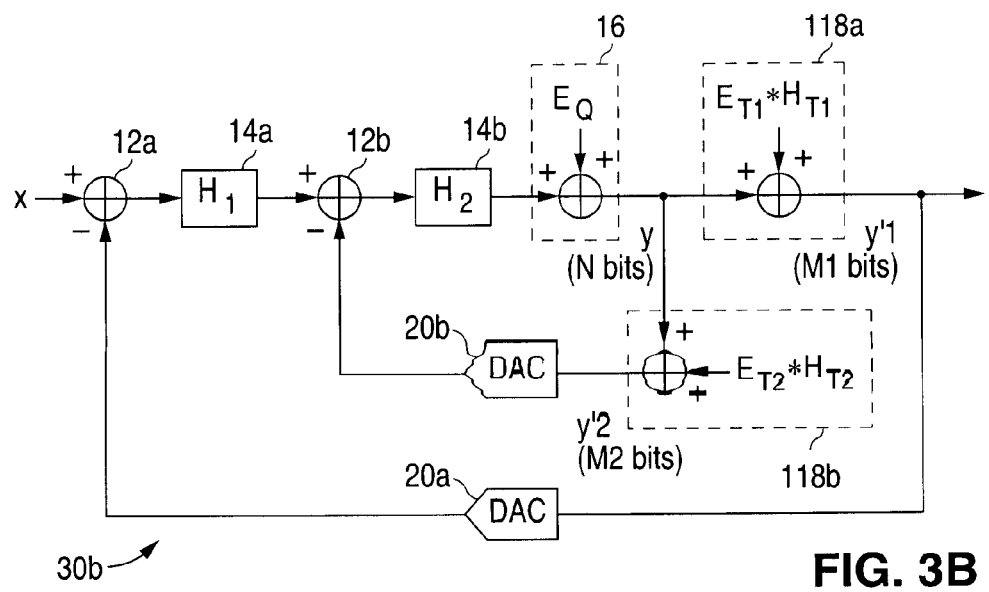
FIG. 3B is a functional block diagram using a DAC resolution reduction technique in accordance with another embodiment of the presently claimed invention.

In the modulator 30a of FIG. 3A, all M bits of the truncated output signal y' are shown as being converted and provided as the same feedback signal to each of the adders 12a, 12b. However, referring to FIG. 3B, it will be readily appreciated by one of ordinary skill in the art that an additional output truncation circuit 118b can be used to provide multiple truncated output signals with a different number of quantization bits, which are converted by a corresponding feedback DAC for summing in a respective one of the adders. For example, in the second order modulator 30b of FIG. 3B, the first output truncation circuit 118a provides truncated output signal y'1 with M1 quantization bits while a second output truncation circuit 118b provides a second truncated output signal y'2 with M2 quantization bits, each of which is converted by its own corresponding feedback DAC 20a, 20b for summing in adders 12a and 12b, respectively. As a result, the truncation error $\epsilon_{T1}*H_{T1}$ injected at the first output truncation circuit 118a is shaped with an order equal to that of the modulator, while the truncation error $\epsilon_{T2}*H_{T2}$ injected at the second output truncation circuit 118b is shaped by a lower order.

Figure 4:
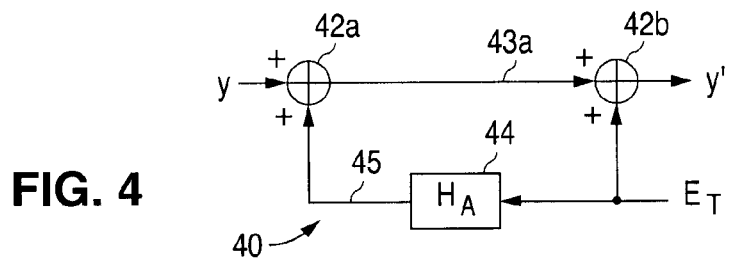
FIG. 4 is a functional block diagram of one example embodiment of the truncation filter for the truncation circuit of FIG. 3A.

Referring to FIG. 4, since the truncation error $\epsilon_T$ is a signal in the digital domain, it can be processed by filtering with a filtering function $H_A$ 44, with the filtered result 45 summed with the quantized signal y, the result 43a of which is further summed with the truncation error $\epsilon_T$ to produce the truncated output signal y'.

It can be seen by inspection that the output signal y' can be expressed as follows:

$$y+H_A\epsilon_T+\epsilon_T=y' \quad (11)$$

Solving this for the truncation error filtering function $H_A$ produces the following:

$$H_A=H_T-1 \quad (12)$$

By way of example, if it is desired to provide an extra second order shaping, the truncation error filtering function $H_T$ can expressed be as follows:

$$H_T=(1-z^{-1})^2 \quad (13)$$

As a result, the internal filtering function $H_A$ will be:

$$H_A=-2z^{-1}+z^{-2} \quad (14)$$

As should be recognized from this example, other implementations of filtering can be used for processing the truncation error $\epsilon_T$, including the introduction of additional zeroes in the z-plane at z=1. Additionally, zeroes can be introduced at other points of the z-plane for optimizing the dynamic range of the operational amplifiers used in the sigma-delta modulator. For example, it may be desirable to have a zero at z=1 and two complex conjugate zeros at less than (e.g., ⅔ of) the Nyquist frequency. As a result, the truncation error filtering function $H_T$ can expressed be as follows:

$$H_T(z)=(1-z^{-1})*(1+z^{-1}+z^{-2})=1-z^{-3} \quad (15)$$

Accordingly the feedback filtering function $H_A$ becomes a simple delay $-z^{-3}$.

Figure 5A:
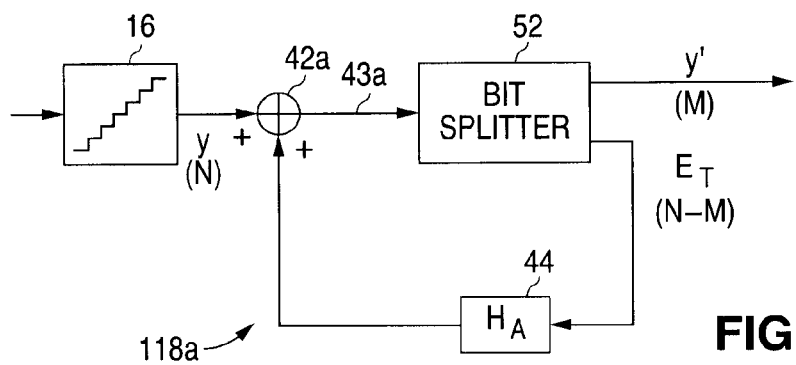
FIG. 5A is a functional block diagram of one example embodiment of the truncation circuit of FIG. 3A.

Referring to FIG. 5A, one example embodiment 118a of the truncation stage includes a bit splitter circuit 52 (which can be implemented in accordance with well-known techniques), the internal filtering function 44 and the summation circuitry 42a, interconnected substantially as shown. The quantized signal y from the quantizer 16 is received, summed with the filtered truncation error $\epsilon_T$, and split by the bit splitter circuit 52. The (N-M)-bit truncation error $\epsilon_T$ is filtered by the filter circuit 44 (e.g., a simple delay $-z^{-3}$, as discussed above) for summing with the N-bit quantizer signal.

Figure 5B:
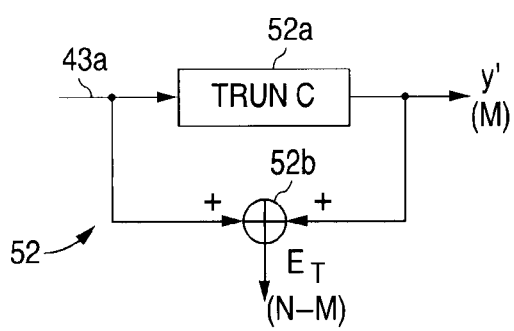
FIG. 5B is a functional block diagram of one example embodiment of the bit splitter circuit of FIG. 5A.

Referring to FIG. 5B, one example embodiment of the bit splitter circuit 52 of FIG. 5A includes a truncation circuit 52a and adder 52b interconnected substantially as shown. The M-bit truncated output signal y' is differentially summed with the N-bit input signal 43a to produce the truncation error $\epsilon_T$.

Based upon the foregoing discussion, it should be recognized that a number of significant benefits are provided by a DAC resolution reduction technique in accordance with the presently claimed invention. One benefit is a reduction in the word length of the output signal y', which simplifies the internal feedback DAC (due to the reduced feedback word length), as well as further processing downstream (e.g., simplifying the first stage of the decimation filter). A second benefit is minimum additional processing in the form of the truncation error filtering function $H_A$. A third benefit is the shaping of the truncation error $\epsilon_T$ by a noise transfer function having an order increased by the order of the truncation filtering function $H_A$ over the order of the host sigma-delta modulator, thereby minimizing, if not eliminating, a need for cancellation of the error. (For example, with a second order sigma-delta modulator and a k-order truncation error filtering function $H_A$, the truncation error $\epsilon_T$ is shaped by a noise transfer function having an order of 2+k.) This last benefit is fully realized when the same truncated output signal y' is fed back as in the circuitry of FIG. 3A; however, when differently truncated output signals y'1, y'2 are fed back as in the circuitry of FIG. 3B, the second truncated output signal y'2 will experience a lower order shaping.

More particularly, with the presently claimed invention, the minimum modulator need only be first order, unlike the prior art (see, e.g., U.S. Pat. No. 6,980,144) which also requires the digital truncation to be of an order higher than that of the modulator (e.g., a second order modulator would require a digital truncation of at least third order). Indeed, in accordance with the presently claimed invention, additional zeros at frequencies other than zero (i.e., z=0) can be introduced as desired, e.g., to further reduce noise outside of the signal band.

Further, modulator designs of third order or higher often suffer from problems with circuit stability, and are generally matched with a lower order digital truncation (see, e.g., U.S. Pat. No. 6,967,608). For example, with a second order modulator and a second order truncation, the quantization error and truncation error are shaped with the same function and appear in the output with similar weights. With the truncation error higher than the quantization, the SNR is dominated by the truncation error, with the result being that the output can appear to have a lower number of bits.

Prior techniques have sought to avoid using digital modulators with orders higher than two and zero delay by estimating the effect of the truncation error after the first analog integrator and to inject at the input of the second integrator a digital signal converted by a DAC for canceling the truncation error that was passed through the first analog integrator. Such a technique can be successful if the estimate of the transfer function of the first analog integrator is accurate. Such designs can be reasonably stable with a large number of truncated bits but tend to become unstable with fewer truncated bits. Also, limitations exist due to mismatches among the various capacitors and finite gain or slew-rate of the operational amplifier which cause the transfer function of the first integrator to be different from the ideal $z^{-1}/(1-z^{-1})$ or $1/(1-z^{-1})$, with such difference tending to reduce the effects of the cancellation. In contrast thereto, as noted above, a modulator in accordance with the presently claimed invention is not affected by stability issues because a lower order modulator (e.g., second order) can be used while still benefiting from the truncation error filter, i.e., resulting in k+2-order digital shaping for a second order modulator with a k-order truncation error filter.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a sigma-delta modulator, comprising:
    an input electrode to convey an analog input signal;
    one or more output electrodes to convey one or more digital output signals;
    one or more adder circuits, wherein a first adder circuit is coupled to said input electrode to receive said analog input signal and one of one or more analog feedback signals and provide a first one of one or more summation signals, and each remaining one of said one or more adder circuits is to receive a respective upstream one of one or more integration signals and a respective additional one of said one or more analog feedback signals and provide a respective additional one of said one or more summation signals;
    one or more integrator circuits, wherein a first integrator circuit is coupled to said first adder circuit to receive said first one of said one or more summation signals and provide a first one of said one or more integration signals, and a last integrator circuit is coupled to a last one of said one or more adder circuits to receive a last one of said one or more summation signals and provide a last one of said one or more integration signals;
    analog-to-digital converter (ADC) circuitry coupled to said last integrator circuit and responsive to said last one of said one or more integration signals by providing an N-bit digital signal;
    truncation circuitry coupled between said ADC circuitry and said one or more output electrodes and responsive to said N-bit digital signal by providing said one or more digital output signals including an M-bit digital signal, wherein N>M; and
    digital-to-analog converter (DAC) circuitry coupled between said one or more output electrodes and each of said one or more adder circuits to receive at least one of said one or more digital output signals and provide said one or more analog feedback signals.

2. The apparatus of claim 1, wherein:
    said sigma-delta modulator comprises an F-order sigma-delta modulator; and
    said truncation circuitry includes E-order filter circuitry, wherein F>E.

3. The apparatus of claim 1, wherein:
    said one or more adder circuits comprises a plurality of F adder circuits;
    said one or more integrator circuits comprises a plurality of F integrator circuits; and
    said truncation circuitry includes E-order filter circuitry, wherein F>E.

4. The apparatus of claim 1, wherein said truncation circuitry comprises:
    adder circuitry responsive to said N-bit digital signal and a filtered signal by providing another N-bit digital signal;
    bit splitting circuitry responsive to said another N-bit digital signal by providing at least said M-bit digital signal and a truncation error signal; and
    filter circuitry coupled to said bit splitting circuitry and responsive to said truncation error signal by providing said filtered signal.

5. The apparatus of claim 4, wherein:
    said sigma-delta modulator comprises an F-order sigma-delta modulator; and
    said filter circuitry comprises an E-order filter circuit, wherein F>E.

6. The apparatus of claim 4, wherein:
    said one or more adder circuits comprises a plurality of F adder circuits;
    said one or more integrator circuits comprises a plurality of F integrator circuits; and
    said filter circuitry comprises an E-order filter circuit, wherein F>E.

7. An apparatus including a sigma-delta modulator, comprising:
    one or more adder means, wherein a first adder means is for adding said analog input signal and one of one or more analog feedback signals to provide a first one of one or more summation signals, a last adder means is for providing a last one of said one or more summation signals, and each remaining one of said one or more adder means is for adding a respective upstream one of one or more integration signals and another of said one or more analog feedback signals to provide a respective additional one of said one or more summation signals;
    one or more integrator means, wherein a first integrator means is for integrating said first one of said one or more summation signals to provide a first one of said one or more integration signals, and a last integrator means is for integrating a last one of said one or more summation signals to provide a last one of said one or more integration signals;

analog-to-digital converter (ADC) means for converting said last one of said one or more integration signals to an N-bit digital signal;

truncation means for truncating said N-bit digital signal to provide one or more digital output signals including an M-bit digital signal, wherein N>M; and digital-to-analog converter (DAC) means for converting at least one of said one or more digital output signals to said one or more analog feedback signals.

* * * * *

UNITED STATES PATENT AND TRADEMARK OFFICE
CERTIFICATE OF CORRECTION

PATENT NO.        : 7,525,464 B2
APPLICATION NO.   : 11/754442
DATED             : April 28, 2009
INVENTOR(S)       : Franco Maloberti et al.

It is certified that error appears in the above-identified patent and that said Letters Patent is hereby corrected as shown below:

At Column 5, Line 10, please delete " $y' = x * z^{-1} + (\varepsilon_Q + \varepsilon_T H_T)(1 - z^{-1})^2$ "

and insert -- $y = x * z^{-1} + (\varepsilon_Q + \varepsilon_T H_T)(1 - z^{-1})^2$ -- in its place.

Signed and Sealed this

Second Day of June, 2009

JOHN DOLL
*Acting Director of the United States Patent and Trademark Office*